(12) United States Patent
Cheng et al.

(10) Patent No.: US 10,461,184 B1
(45) Date of Patent: Oct. 29, 2019

(54) TRANSISTOR HAVING REDUCED GATE-INDUCED DRAIN-LEAKAGE CURRENT

(71) Applicant: International Business Machines Corporation, Armonk, NY (US)

(72) Inventors: Kangguo Cheng, Schenectady, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/971,360

(22) Filed: May 4, 2018

(51) Int. Cl.
| | | |
|---|---|---|
| *H01L 29/78* | (2006.01) | |
| *H01L 29/66* | (2006.01) | |
| *H01L 29/08* | (2006.01) | |
| *H01L 29/165* | (2006.01) | |
| *H01L 21/02* | (2006.01) | |
| *H01L 29/10* | (2006.01) | |
| *H01L 21/324* | (2006.01) | |

(52) U.S. Cl.
CPC .... *H01L 29/7827* (2013.01); *H01L 21/02532* (2013.01); *H01L 21/324* (2013.01); *H01L 29/0847* (2013.01); *H01L 29/1037* (2013.01); *H01L 29/165* (2013.01); *H01L 29/6656* (2013.01); *H01L 29/66666* (2013.01); *H01L 29/7848* (2013.01)

(58) Field of Classification Search
CPC ............ H01L 29/7827; H01L 29/1037; H01L 29/6656; H01L 29/7848; H01L 29/165; H01L 29/0847; H01L 29/66666; H01L 21/324; H01L 21/02532
See application file for complete search history.

(56) References Cited

U.S. PATENT DOCUMENTS

| | | |
|---|---|---|
| 9,287,374 B2 | 3/2016 | Lee et al. |
| 9,306,063 B2 | 4/2016 | Doyle et al. |
| 9,337,309 B1 | 5/2016 | Basu et al. |
| 9,502,265 B1 | 11/2016 | Jiang et al. |

(Continued)

OTHER PUBLICATIONS

Lee et al. "Engineering the electronic defect bands at the Si 1-x Ge x/IL interface: Approaching the intrinsic carrier transport in compressively-strained Si 1-x Ge x pFETs." In IEEE International Electron Devices Meeting (IEDM), 2016, pp. 31-1.1 to 31-1.4 (2016).

*Primary Examiner* — Ahmed N Sefer
(74) *Attorney, Agent, or Firm* — Cantor Colburn LLP; Vazken Alexanian

(57) ABSTRACT

A semiconductor device includes a semiconductor substrate having a first source or drain (S/D) region and a channel. The channel includes a first semiconductor material having a first band gap, and extends vertically from a lower channel portion formed on the first S/D region to an upper channel portion located opposite the lower channel portion. A gate structure is around sidewalls of the channel, and a second S/D region is on the upper channel portion. A band-gap enhancing region is interposed between the second S/D region and the channel. The band-gap enhancing region includes a second semiconductor material having a second band gap that is greater than the first band gap to reduce a gate-induced-drain leakage (GIDL) between the second S/D region and the channel.

15 Claims, 10 Drawing Sheets

(56) References Cited

U.S. PATENT DOCUMENTS

| | | |
|---|---|---|
| 9,564,200 B2 | 2/2017 | Lee |
| 9,564,514 B2 | 2/2017 | Basu et al. |
| 2007/0146008 A1 | 6/2007 | Tak et al. |
| 2008/0251825 A1 | 10/2008 | Lee |
| 2015/0144998 A1* | 5/2015 | Ching ............... H01L 29/785 257/190 |
| 2015/0249153 A1* | 9/2015 | Morin ............... H01L 29/785 257/192 |
| 2016/0056160 A1 | 2/2016 | Jang et al. |
| 2016/0322358 A1* | 11/2016 | Ching ............... H01L 27/0924 |
| 2016/0372519 A1 | 12/2016 | Oh |
| 2017/0033175 A1 | 2/2017 | Oda et al. |
| 2019/0035923 A1* | 1/2019 | Sadana ............... H01L 29/785 |

* cited by examiner

TRANSISTOR HAVING REDUCED GATE-INDUCED DRAIN-LEAKAGE CURRENT

BACKGROUND

The present invention relates in general to semiconductor devices and their fabrication. More specifically, the present invention relates to improved fabrication methodologies and resulting structures for a vertical field effect transistor (VFET) having reduced gate-induced drain-leakage (GIDL) current.

In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. The term "planar" is often used to describe a conventional geometry for MOSFETs in which the various component parts of the MOSFET device are laid down as planes or layers.

VFETs are one example of a non-planar MOSFET geometry. VFETs employ semiconductor fins and side-gates that can be contacted outside the active region, resulting in increased device density along with increased performance over planar or lateral devices. In VFETs, the source-to-drain current flows in a direction that is perpendicular to a major surface of the substrate. The fin forms a vertical channel region of the VFET. A source region and a drain region are in electrical contact with the top and bottom ends of the channel region, and a gate is located on sidewalls of the fins. An important performance parameter in designing VFETs is minimizing the presence of off-state leakage currents such as GIDL current.

SUMMARY

Embodiments of the invention are directed to a method of forming a semiconductor device. A non-limiting example method includes forming a semiconductor fin, which includes a first type of semiconductor material having a first band gap, and extends vertically from a first source or drain (S/D) region of the semiconductor device. The method further comprises converting an upper portion of the semiconductor fin into a second semiconductor material having a second band gap that is greater than the first band gap. The method further includes forming a second S/D region on the second semiconductor material so that the second semiconductor material is interposed between a non-converted portion of the semiconductor fin and the second S/D region.

Embodiments of the invention are directed to a method of forming a semiconductor device. A non-limiting example method includes forming a vertical fin comprising a first semiconductor material having a first band gap. The vertical fin extends vertically from a first source or drain (S/D) region of the semiconductor device. The method further comprises forming a gate structure around portions of sidewalls of the vertical fin such that the portions of the vertical fin adjacent to the gate structure comprise a channel of the semiconductor device. The method further comprises forming a second S/D region on an upper portion of the vertical fin, and converting the upper portion of the vertical fin into a second semiconductor material having a second band gap that is greater than the first band gap to reduce a gate-induced-drain leakage (GIDL) between the second S/D region and the channel.

Embodiments of the invention are directed to a semiconductor device. A non-limiting example of the semiconductor device includes a semiconductor substrate having a first source or drain (S/D) region and a channel. The channel includes a first semiconductor material having a first band gap, and extends vertically from a lower channel portion formed on the first S/D region to an upper channel portion located opposite the lower channel portion. A gate structure is around sidewalls of the channel, and a second S/D region is on the upper channel portion. A band-gap enhancing region is interposed between the second S/D region and the channel. The band-gap enhancing region includes a second semiconductor material having a second band gap that is greater than the first band gap to reduce a gate-induced-drain leakage (GIDL) between the second S/D region and the channel.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

Figure 1:
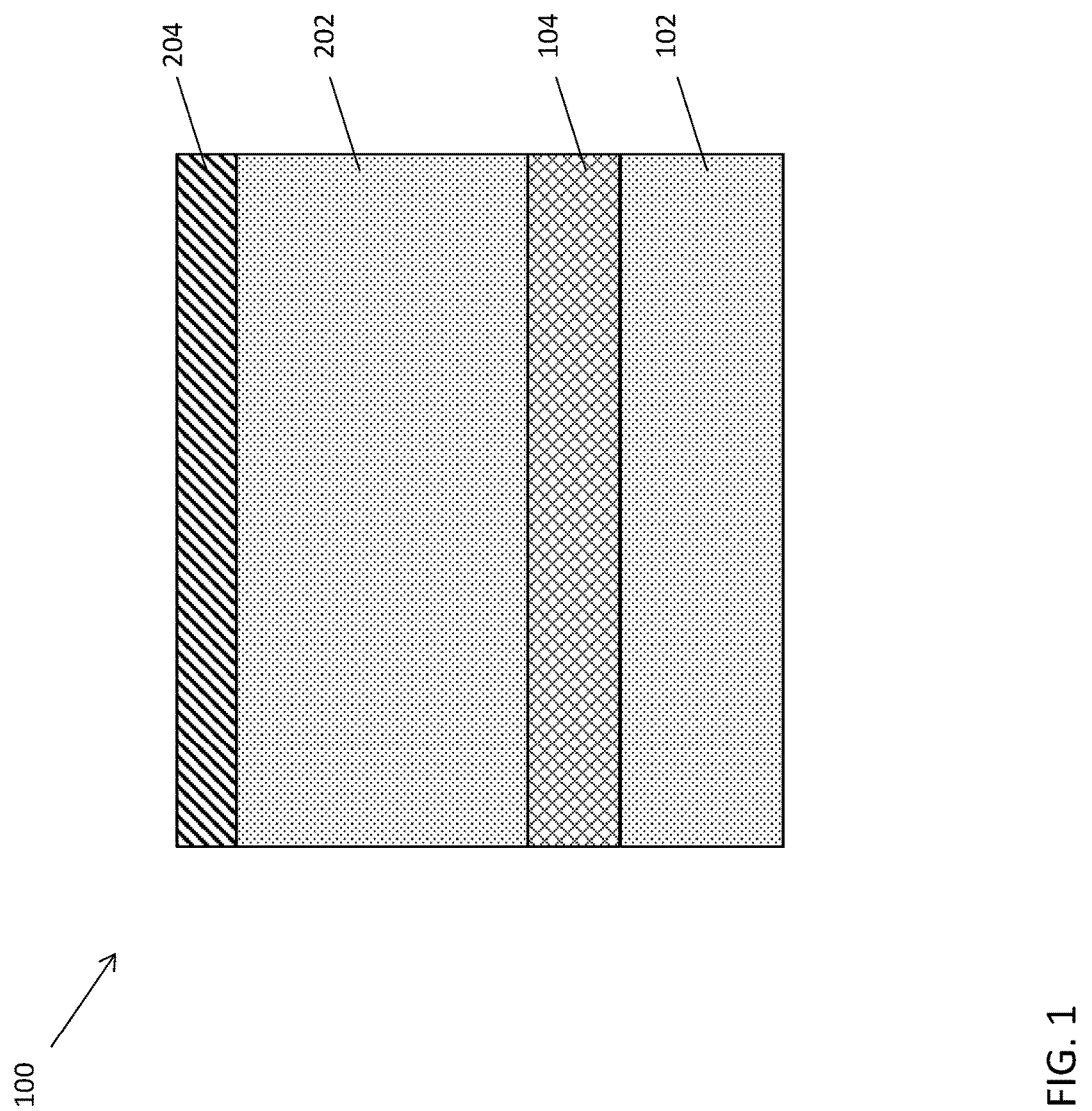
FIG. 1 depicts a semiconductor structure after performing operations for fabricating a semiconductor device having a reduced gate-induced drain-leakage (GIDL) current according to embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although the examples provided in this written description focus on fabrication operations and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed. Additionally, although the examples provided in this written description focus on a VFET structure having a silicon (Si) substrate and silicon germanium (SiGe) fin channels, the teachings can be utilized with other semiconductor materials and combinations of semiconductor materials. Additionally, although examples of the invention provided herein are described in terms of forming a band gap enhancing region (e.g., Si-rich layer) between the channel region and a drain region located at the upper region of the VFET, the teachings apply equally when forming a band gap enhancing region between the channel region and a source region located at the upper region of the VFET.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, may or may not be used herein for ease of description to describe one element or feature's relationship to another element(s) or feature(s) as illustrated in the figures. Persons skilled in the art will understand that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

Turning now to an overview of technologies that are more specifically relevant to aspects of the present invention, the use of SiGe to form elements (e.g., the fin channels, and source/drain contacts) of a FET device (e.g., a VFET) can provide desirable device characteristics. In the case of a p-type transistor (e.g., pFETs) for example, hole mobility through a SiGe channel is higher compared to hole mobility through a silicon channel (i.e. a channel excluding germanium). Accordingly, many applications benefit from forming the fin channels of a p-type VFET from SiGe. Further, using a SiGe source/drain contact having a greater percentage of germanium compared to the percentage of germanium included in the channel can reduce contact resistance between the source/drain region and contact interface (e.g., contact metal interface).

However, SiGe has a relatively narrow band gap compared to silicon (Si). In solid-state physics, a band gap is typically an energy range in a solid where no electron states can exist. More specifically, a band gap is the energy difference between the top of the valence band and the bottom of the conduction band of the material. If the valence band is completely full and the conduction band is completely empty, electrons cannot move in the solid. However, if some electrons transfer from the valence band to the conduction band, current can flow. Therefore, the size of the band gap is a major factor in determining the electrical conductivity of a solid. Substances with very large band gaps are generally insulators, and substances with smaller band gaps are semiconductors. Substances that are conductors have either very small band gaps or none. As a result, the combination of a SiGe channel and SiGe source/drain contact can have a negative impact on the ability to suppress off-state leakage currents. For instance, an interface formed between a SiGe channel and a SiGe drain contact can cause a relatively high gate to drain voltage difference, which can promote gate-induced-drain-leakage (GIDL) current that negatively affects device performance.

As FET devices with smaller and smaller feature sizes have been developed, the ratio of leakage to operating current increases. At the same time, the trend into mobile applications requires a minimum power loss to support long battery life. For low-power applications, reducing leakage current such as GIDL is an important performance parameter. Because off-state leakage currents waste power, it is desirable to keep such leakage currents as low as possible, or to eliminate them altogether. Therefore, conventional VFET devices typically form the source/drain contact from Si or low Ge concentration SiGe to mitigate GIDL, but consequently realizes an undesirable increases in source/drain contact resistance. In addition, GIDL occurs at the channel and drain interface, which is typically located at the upper portion of the VFET while the source contact is formed at the lower portion of the VFET.

Turning now to an overview of aspects of the invention, embodiments of the invention leverage the observation that GIDL current is closely related to the semiconductor band-gap energy in the S/D regions of the VFET. Accordingly, improved fabrication methodologies and resulting structures according to one or more embodiments of the invention provide a VFET having a band gap enhancing region interposed between the SiGe channel and the SiGe drain contact. The Si-rich layer increases the band gap between the channel-drain interface, thereby reducing gate-induced-drain-leakage (GIDL) current. Therefore, the VFET according to embodiments of the invention reduces the overall off-state leakage currents compared to conventional VFET devices, and in particular p-type VFETs, while still allowing for the use of SiGe source/drain contacts to achieve reduced contact resistance.

Turning now to a more detailed description of aspects of the invention, FIG. 1 depicts a semiconductor structure 100 after performing operations for fabricating a VFET semiconductor device 900 (shown in FIG. 9) having a reduced gate-induced drain-leakage (GIDL) current according to embodiments of the invention. As shown in FIG. 1, known semiconductor device fabrication operations have been used to form the semiconductor structure 100, which includes a bulk semiconductor substrate 102, a doped semiconductor layer 104, an active semiconductor layer 202, and a hardmask layer 204. The doped semiconductor layer 104 is interposed between the bulk semiconductor substrate 102 and the active semiconductor layer 202. The hardmask layer 204 is formed on an upper surface of the active semiconductor layer 202.

In embodiments of the invention, the bulk semiconductor layer 102 can be any suitable semiconductor substrate material, including, for example, mono-crystalline silicon. In embodiments of the invention, the bulk semiconductor layer 102 can include a buried insulator layer (not shown).

Figure 9:
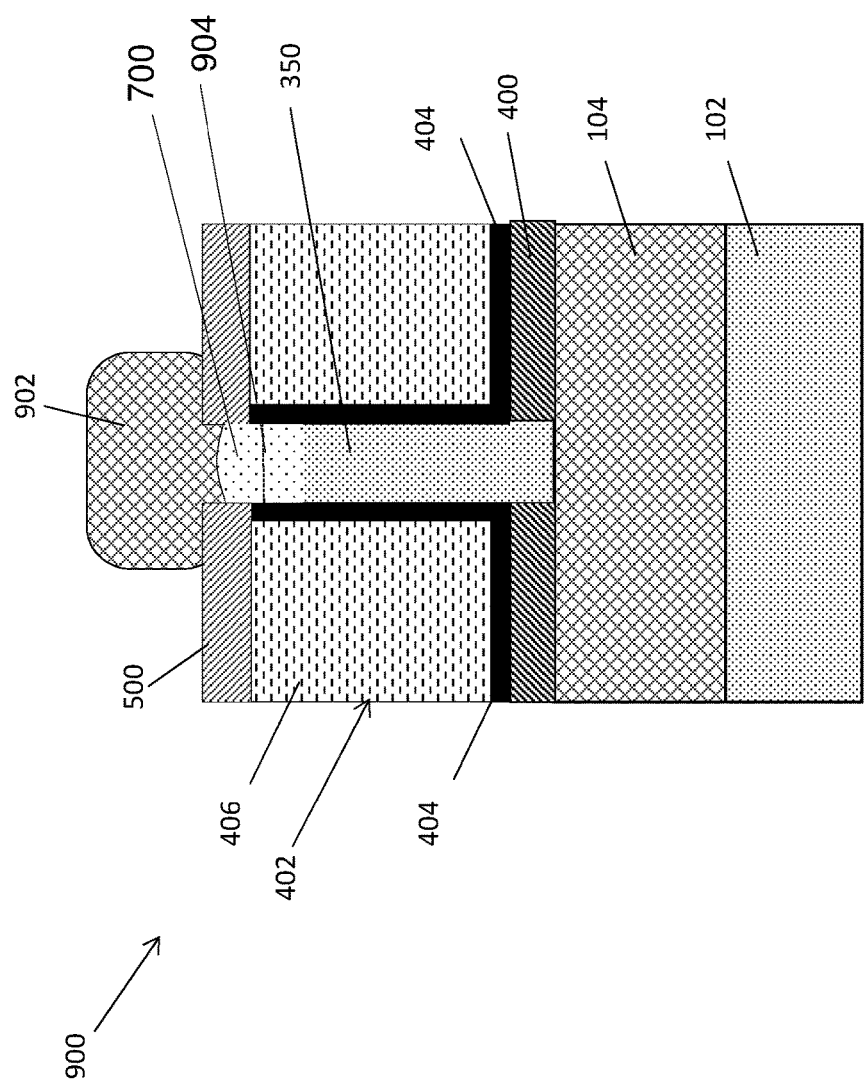
FIG. 9 depicts a cross-sectional view of the semiconductor structure after performing various fabrication processes according to embodiments of the invention according to embodiments of the invention.

The doped semiconductor layer 104 serves to form a lower source/drain region 104 in the final VFET device 900 (shown in FIG. 9). In some embodiments of the invention, the lower source/drain region 104 is a source region, while in other embodiments of the invention the lower source/drain region 104 is a drain region. The doped semiconductor layer 104 can be a layer of highly boron or gallium doped SiGe layer, in which Ge concentration is higher than 50% to increase the dopant solubility and to reduce the contact resistance.

The doped semiconductor layer 104 can be epitaxially grown and doped through in-situ doping during the epitaxial growth process. The doped semiconductor layer 104 can also be doped through ion implantation after the doped semiconductor layer 104 has been formed on the bulk semiconductor layer 102. Other doping techniques can also be performed to form the doped semiconductor layer including but not limited to, gas phase doping, plasma doping, plasma immersion ion implantation, cluster doping, infusion doping, liquid phase doping, solid phase doping, or any suitable combination of the techniques described herein.

The active semiconductor layer 202 is formed from a semiconductor material, which provides the material for forming the channel region. In embodiments of the invention, the active semiconductor layer 202 can include SiGe to form a SiGe channel as described herein. SiGe is utilized, for example, because a subsequently formed semiconductor fin 302 (shown in FIG. 2) can be formed of a semiconductor material having a targeted chemical element (e.g., Ge). The chemical element can be subsequently pulled out of a portion of the channel region as described herein. In addition, in terms of p-type VFET devices, a channel formed from SiGe increases hole mobility. In embodiments of the invention, the active semiconductor layer 202 contains from about 20% to about 50% of Ge.

The hardmask layer 204 can be deposited on the active semiconductor layer 202 using any suitable deposition process. The hardmask layer 204 can be a dielectric material including, but not limited to, silicon nitride (SiN), silicon oxide (SiO$_2$), or a combination of SiN and SiO$_2$. Accordingly, the hardmask layer 204 can be patterned along with the active semiconductor layer 202 to form a hardmask cap 304 (shown in FIG. 2) on top of the semiconductor fin 302 (shown in FIG. 2). Accordingly, the hardmask cap can protect the semiconductor fin 302 when performing various subsequent fabrication processes.

Figure 2:
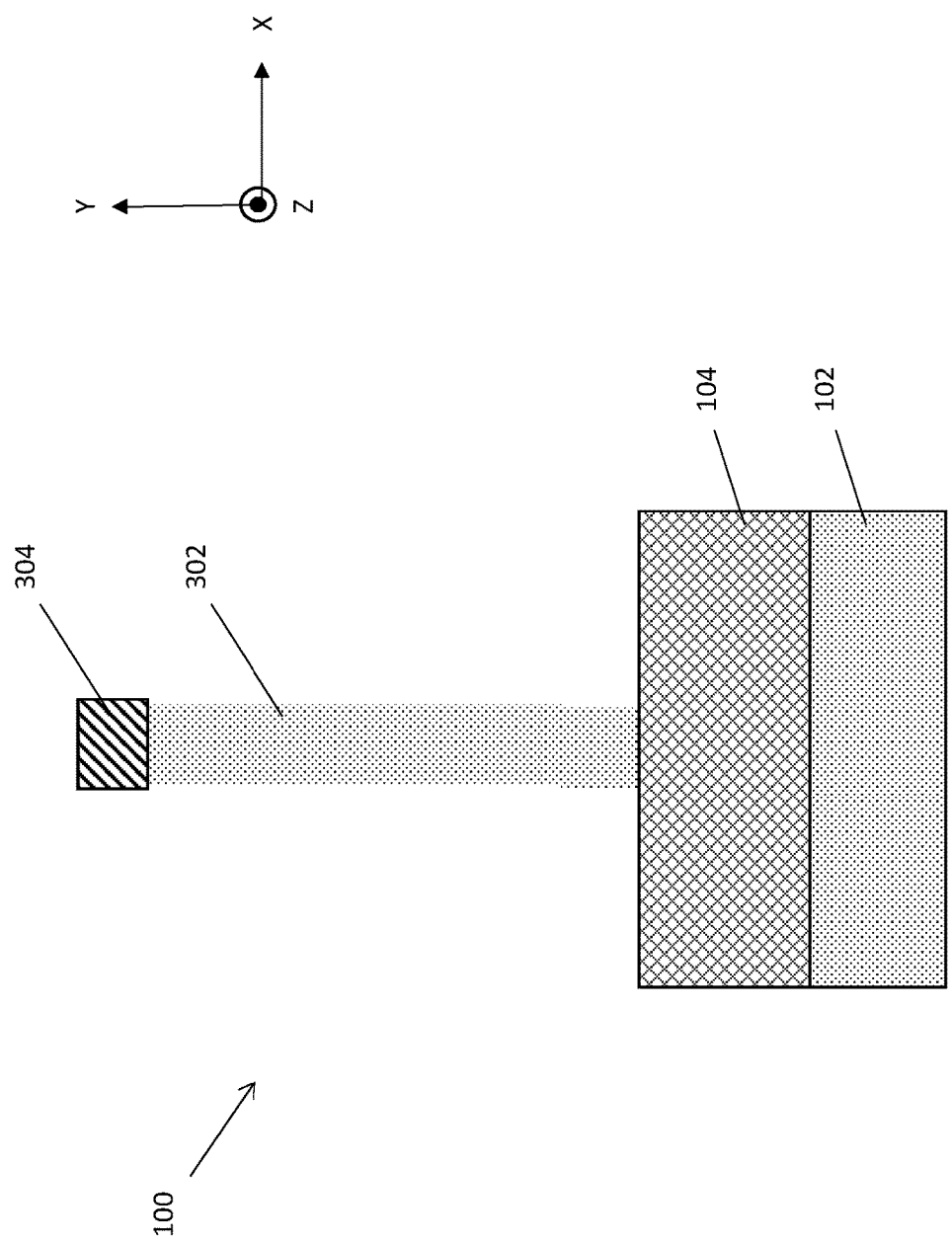
FIG. 2 is a cross-sectional view of the semiconductor structure after performing various fabrication processes according to embodiments of the invention.

In FIG. 2, known semiconductor fabrication operations have been applied to the semiconductor structure 100 to form the fin 302 and the hardmask cap 304 from the active semiconductor layer 202 (shown in FIG. 1) and the hardmask layer 204 (shown in FIG. 1). The known semiconductor device fabrication processes include, but are not limited to, patterning and lithography, self-aligned double patterning, self-aligned quadruple patterning, and the like. In embodiments of the invention, one or more semiconductor fins 302 are formed on the lower source/drain region 104, and a hardmask cap 304 is formed on an upper surface of the semiconductor fin 302. In embodiments of the invention, the hardmask cap 304 can be formed by patterning the original hardmask layer 204 and transferring the pattern into the active semiconductor layer 202 while stopping on the lower source/drain region 104. The pattern can be transferred into the active semiconductor layer 202 using, for example, a wet etch, a dry etch, or a combination thereof. As a result, portions of the active silicon layer 202 are exposed, which can then be removed or recessed to form the semiconductor fin 302.

When forming a VFET, the source/drain (S/D) regions are arranged at opposing ends of the semiconductor fin 302, which will become the vertical channel region 350 of the final VFET 900 shown in FIG. 9. Accordingly, the semiconductor fin 302 extends vertically from a lower portion formed on the lower source/drain region 104 to an upper surface and serves to form the channel of the final VFET 900. The semiconductor fin 302 extends along a first axis (e.g., X-axis) to define a width, and a second axis (e.g., Y-axis) perpendicular to the X-axis to define a height. Although not illustrated in FIG. 1, it is appreciated that the semiconductor fin 302 also extends along a third axis (e.g., Z-axis) perpendicular to the first axis and the second axis to define a length. In terms of VFETs, the height of the semiconductor fin is greater than the width. For example, the height of the semiconductor fin 302 can range from about 10 nanometers to about 100 nm, while the width can range from about 3 nm to about 15 nm and the length can range from 10 nm to 200 nm. Because the semiconductor fin 302 is formed from the initial active semiconductor layer 202, the semiconductor fin 302 is also composed of SiGe with the Ge percentage ranging from about 20% to about 50%.

Figure 3:
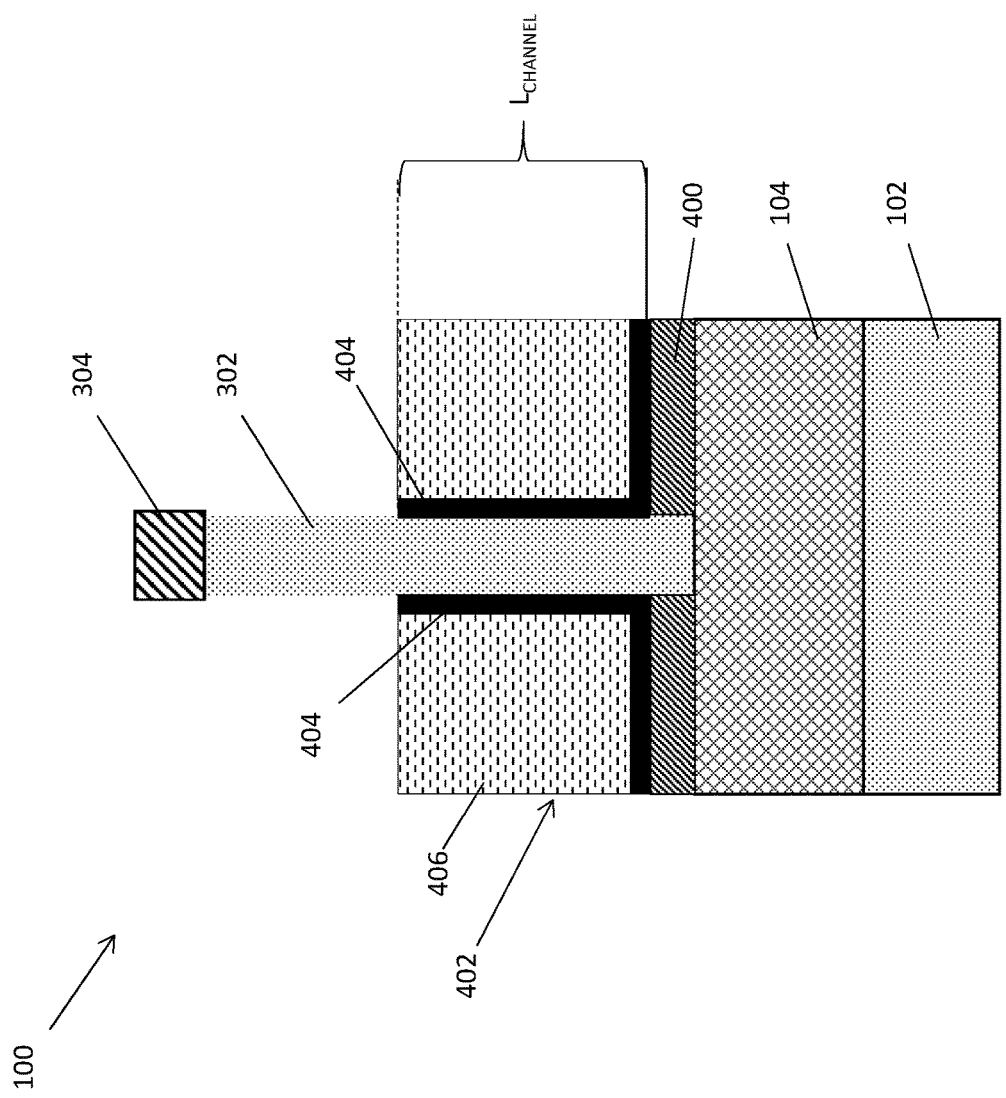
FIG. 3 depicts a cross-sectional view of the semiconductor structure after performing various fabrication processes according to embodiments of the invention.

In FIG. 3, known semiconductor fabrication operations have been applied to the semiconductor structure 100 to form a bottom spacer 400 and a gate structure 402, configured and arranged as shown. In embodiments of the invention, the gate structure 402 includes a gate dielectric 404 and an electrically conductive gate electrode 406. In embodiments of the invention, the bottom spacer 400 is formed on a top surface of the lower source/drain region 104. In embodiments of the invention, the top surface of the bottom spacer 400 is above a top surface of the lower source/drain region 104. In embodiments of the invention, a portion of the lower source/drain region 104 adjacent the semiconductor fin 302 can be recessed. The bottom spacer 400 can then be formed on the upper surface of the recessed portions so that the top surface of the bottom spacer 400 can be made coplanar with the top surface of the lower source/drain region 104.

The bottom spacer 400 can be a dielectric material such as SiO$_2$, SiN, silicon oxynitride, a low-k material, or any suitable combination of these materials. A low-k material is typically viewed as a dielectric material having a dielectric constant (k) lower than about 3.9. Exemplary low-k materials include, but are not limited to, amorphous carbon, fluorine-doped oxides, carbon-doped oxides, SiCOH, or SiBCN. The bottom spacer 400 can have a thickness ranging, for example, from about 4 nanometers (nm) to about 20 nm. Various deposition process can be used to deposit the bottom spacer 400 including, but not limited to, chemical vapor deposition (CVD) or plasma enhanced chemical vapor deposition (PECVD). In embodiments of the invention, a material can also be considered low-k when the material's dielectric constant is less than that of silicon nitride. The k-value of SiN is about 7.0.

Still referring to FIG. 3, the gate structure 402 (i.e., the gate dielectric 404 and an electrically conductive gate electrode 406) can be formed on the upper surface of the bottom spacer 400 and around the sidewalls of the semiconductor fin 302. The portion of the semiconductor fin 302 located between an upper surface of the bottom spacer 400 and an upper surface of the gate electrode 406 can define a channel length ($L_{CHANNEL}$). Although not illustrated, the gate structure 402 can also include one or more work function metal layers and/or metal gate liners.

The gate dielectric 404 can be formed from various dielectric materials including, but not limited to, $SiO_2$, SiN, silicon oxynitride, or other suitable material. In embodiments of the invention, the gate dielectric 404 can be a high-k material. As described herein, a high-k material has a dielectric constant (k) greater than about 3.9, and, in embodiments of the invention, a material can also be considered low-k when the material's dielectric constant is less than that of silicon nitride. The k-value of SiN is about 7.0. The high-k dielectric 404 can include a binary or ternary compound such as hafnium oxide ($HfO_2$). Further examples of high-k dielectrics include, but are not limited to, ZrO2, La2O3, $Al_2O_3$, TiO2, SrTiO3, BaTiO3, LaAlO3, Y2O3, HfOxNy, HfSiOxNy, ZrOxNy, La2OxNy, Al2OxNy, TiOxNy, SrTiOxNy, LaAlOxNy, Y2OxNy, SiOxNy, SiNx, a silicate thereof, and an alloy thereof. Each value of x can independently vary from 0.5 to 3, and each value of y can independently vary from 0 to 2. Various deposition processes can be performed to deposit the gate dielectric 404 including, but not limited to, atomic layer deposition (ALD), CVD, physical vapor deposition (PVD), PECVD, thermal oxidation, UV-ozone oxidation, or combinations thereof.

The gate electrode 406 can include a conductive material such as polysilicon (poly-Si), a conductive metal such as aluminum (Al), tungsten (W), copper (Cu), titanium (Ti), tantalum (Ta), platinum (Pt), silver (Ag), gold (Au), ruthenium (Ru), iridium (Ir), rhodium (Rh) and rhenium (Re), alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The thickness of the gate electrode 406 can range, for example, from about 3 nm to about 20 nm.

Following formation of the gate electrode 406, the gate structure 402 is recessed so that the height of the gate structure 402 is less than (e.g., half) the height of the semiconductor fin 302. In this manner, the semiconductor fin 302 can be accessed to perform a chemical pull-out process, which is described in greater detail below. Known semiconductor device fabrication process including a selective dry or wet etch can be used to recess the gate structure 402. The selective wet or dry etch process is highly selective to the hardmask cap 304 and semiconductor fin 302. Therefore, the hardmask cap 304 can protect the underlying semiconductor fin 302 while performing the selective wet or dry etch process to recess the gate structure 402.

Figure 4:
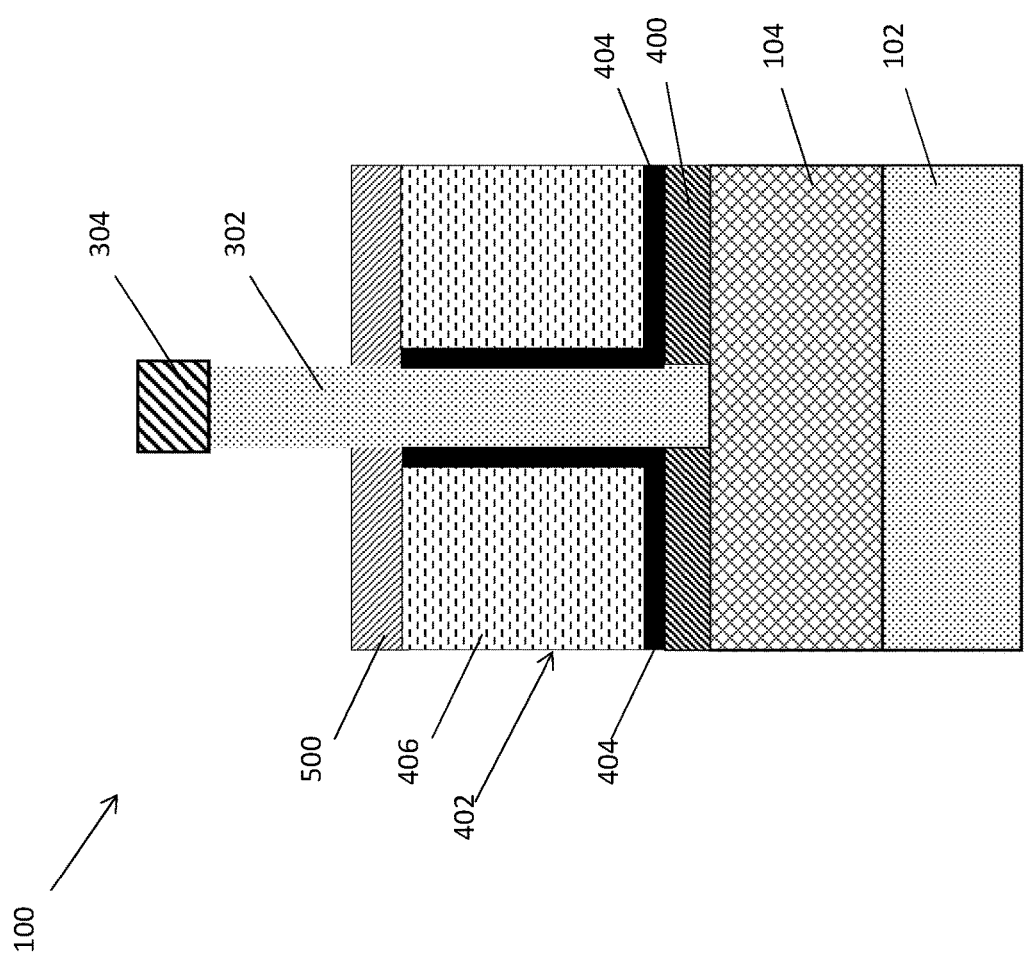
FIG. 4 depicts a cross-sectional view of the semiconductor structure after performing various fabrication processes according to embodiments of the invention.

In FIG. 4, known semiconductor fabrication operations have been applied to the semiconductor structure 100 to form a top spacer 500 on an upper surface of the gate structure 402. The top spacer 500 can be a dielectric material such as $SiO_2$SiN, silicon oxynitride, a low-k material, or any suitable combination of these materials. The top spacer 500 can have a thickness ranging, for example, from about 4 nanometers (nm) to about 20 nm. Various deposition process can be used to deposit the top spacer 500 including, but not limited to, chemical vapor deposition (CVD) or plasma enhanced chemical vapor deposition (PECVD).

Figure 5:
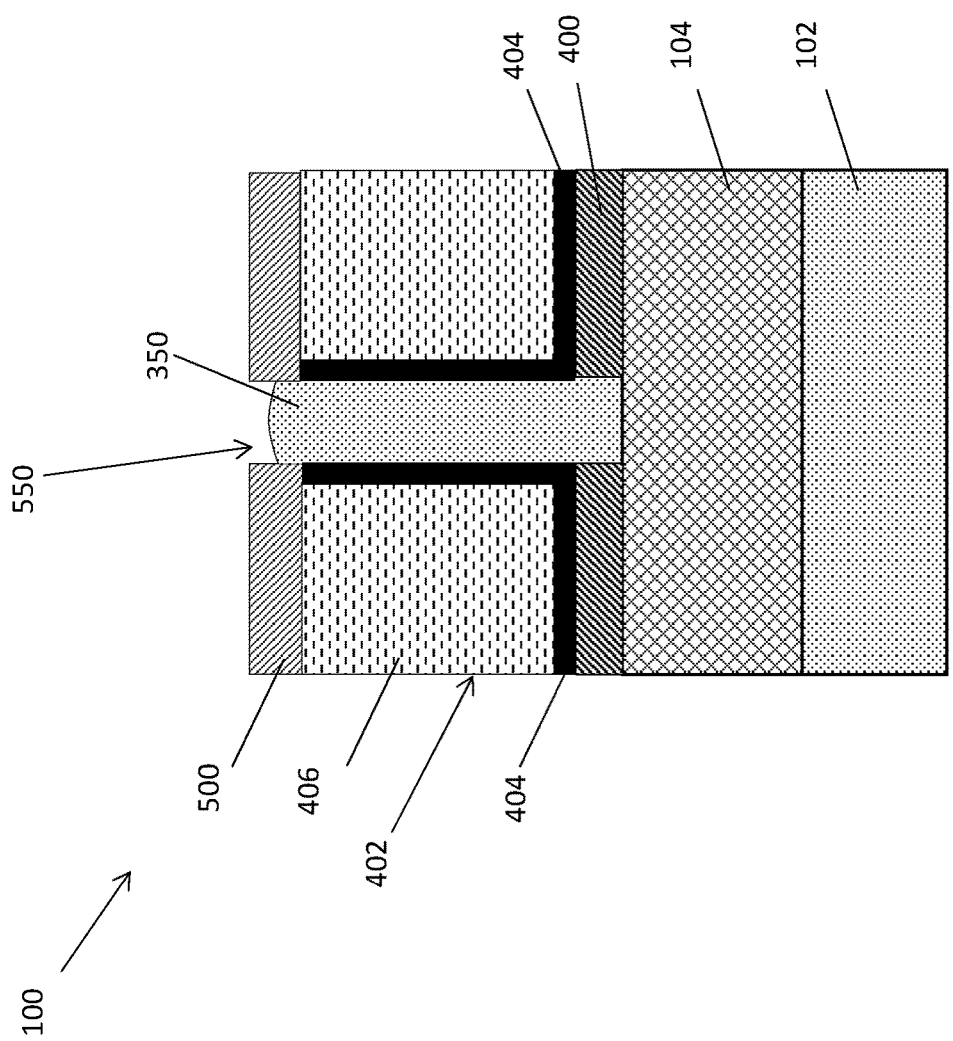
FIG. 5 depicts a cross-sectional view of the semiconductor structure after performing various fabrication processes according to embodiments of the invention.

In FIG. 5, known semiconductor fabrication operations have been applied to the semiconductor structure 100 to recess a portion of the semiconductor fin 302 below the top spacer layer 500 to effectively form the vertical channel 350. Accordingly, a trench 550 is formed in the top spacer 500 so that channel 350 can be still be accessed. An isotropic wet etching process can be used to recess the semiconductor fin 302 so that an upper surface of the resulting channel 350 is formed below the top spacer 500 but above the upper surface of the gate structure 402. In embodiments of the invention, the upper surface of the channel 350 is located about 2 nm above the upper surface of the gate structure 402.

Figure 6:
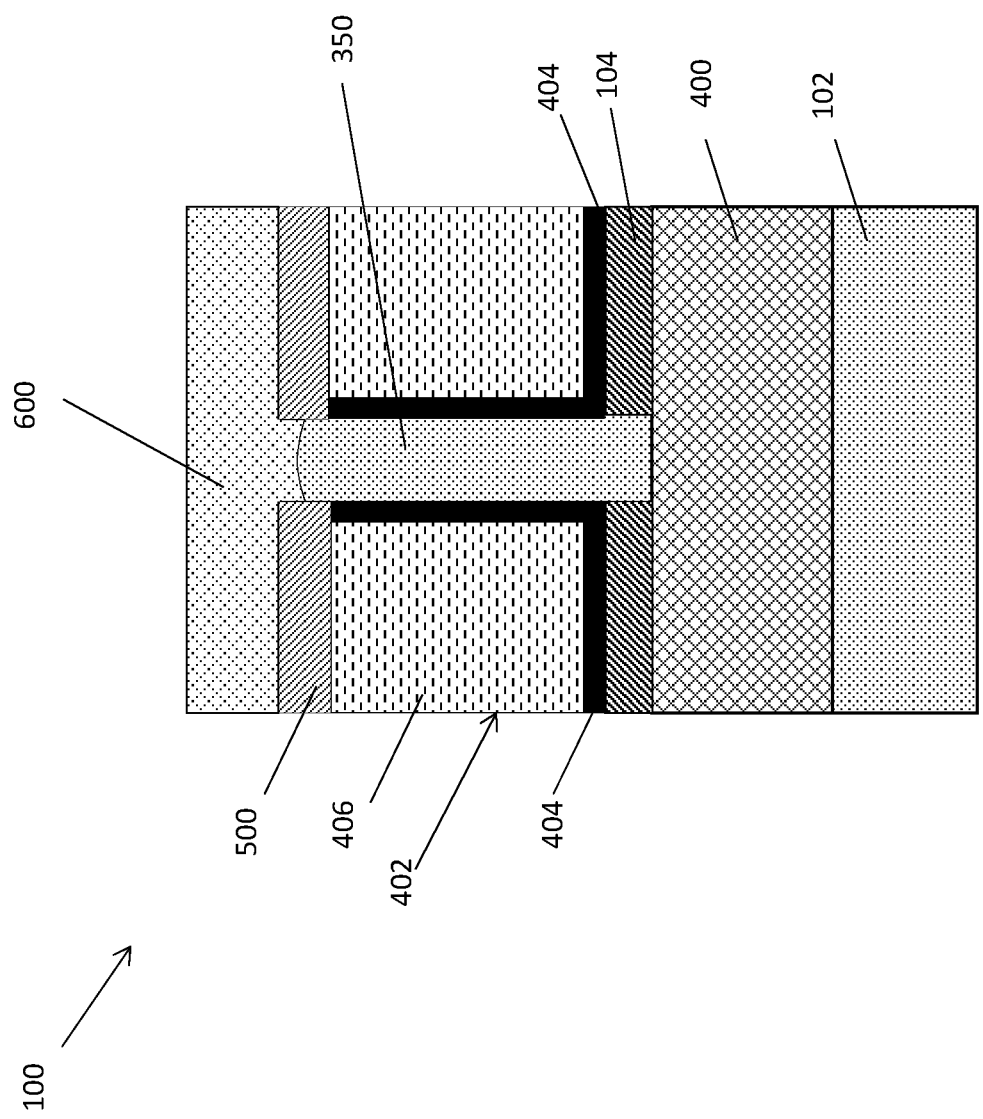
FIG. 6 depicts a cross-sectional view of the semiconductor structure after performing various fabrication processes according to embodiments of the invention according to embodiments of the invention.

In FIG. 6, known semiconductor fabrication operations have been applied to the semiconductor structure 100 to form a sacrificial recipient layer 600 on upper surfaces of the top spacer layer 500 and the channel 350. The sacrificial recipient layer 600 is formed of a material that can thermally react with the underlying channel 350, and pull targeted atoms (e.g., Ge atoms) therefrom. The recipient layer 600 can be deposited using various deposition processes such as CVD, for example. The thickness of the recipient layer 600 can dictate the height of a resulting band-gap enhancing region 700 (shown in FIG. 8), which is described in greater detail below. In embodiments of the invention, however, the recipient layer 600 can have a thickness ranging, for example, from about 5 nm to about 15 nm.

In embodiments of the invention, the recipient layer 600 can be an oxide material configured to receive the targeted atoms contained in the channel 350 based at least in part on a thermal annealing process. In embodiments of the invention, the recipient layer 600 can be SiGeOx in order to pull out the targeted atoms (i.e., targeted Ge) from the underlying SiGe channel 350 when undergoing a thermal anneal process. In other words, the chemical reaction of the SiGe channel 350 and the recipient layer 600 induces the upper portion of the channel 350 to release some of its Ge atoms by the thermal anneal process, which are then removed, e.g., evaporated as volatile species by the volatile product of 2GeO. Accordingly, the pull-out process reduces the concentration of a targeted chemical element (e.g., Ge) from the upper portion of channel 350 (e.g., the SiGe channel 350).

Figure 7:
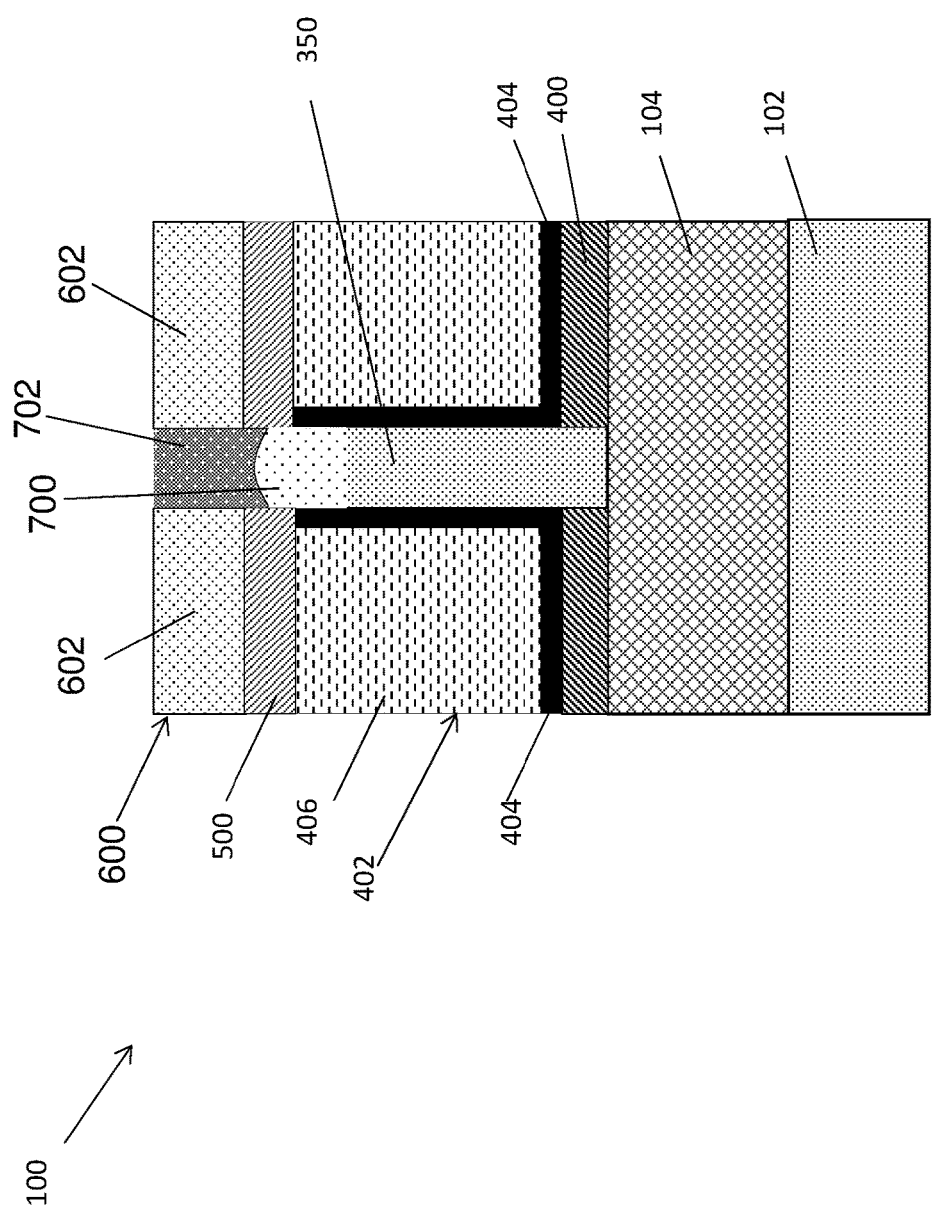
FIG. 7 depicts a cross-sectional view of the semiconductor structure after performing various fabrication processes according to embodiments of the invention according to embodiments of the invention.

In FIG. 7, known semiconductor fabrication operations have been applied to the semiconductor structure 100 to apply the above-described thermal spike anneal process, which heats the semiconductor structure 100 to temperatures ranging, for example, from about 900 degrees Celsius (° C.) to about 1100 degrees ° C., and which causes the SiGe channel 350 to chemically react with the recipient layer 600. In the example illustrated in FIG. 7, the SiGeOx composition of the recipient layer 600 includes a combination of silicon oxide (SiOx) and germanium oxide (GeOx). The spike anneal promotes the chemical reaction of between the SiGeOx in the recipient layer 600 and the SiGe in the channel region 350, which then pulls out the Ge atoms from the channel region 350. As a result, an upper portion of the channel 350 is converted into a silicon-rich (Si-rich) band-gap enhancing region 700, while a portion 702 of the recipient layer 600 is converted into $SiO_2$. In embodiments of the invention, the converted recipient layer portion 702 is formed directly above the band-gap enhancing region 700 and between opposing unreacted portions 602 of the recipient layer 600.

The band-gap enhancing region 700 can have a height dimension defined by the distance extending between the non-reacted SiGe channel 350 and the converted recipient layer portion 702. The height of band-gap enhancing region 700 can range, for example, from about 4 nm to about 6 nm, but is not limited thereto. Different heights of the band-gap enhancing region 700 can be selected according to various design choices of the final VFET. Accordingly, the height of the band-gap enhancing region 700 can be controlled based on the percentage of targeted atoms (e.g., Ge) contained in channel 350 and/or the thickness (e.g., vertical height) of the recipient layer 600.

Figure 8:
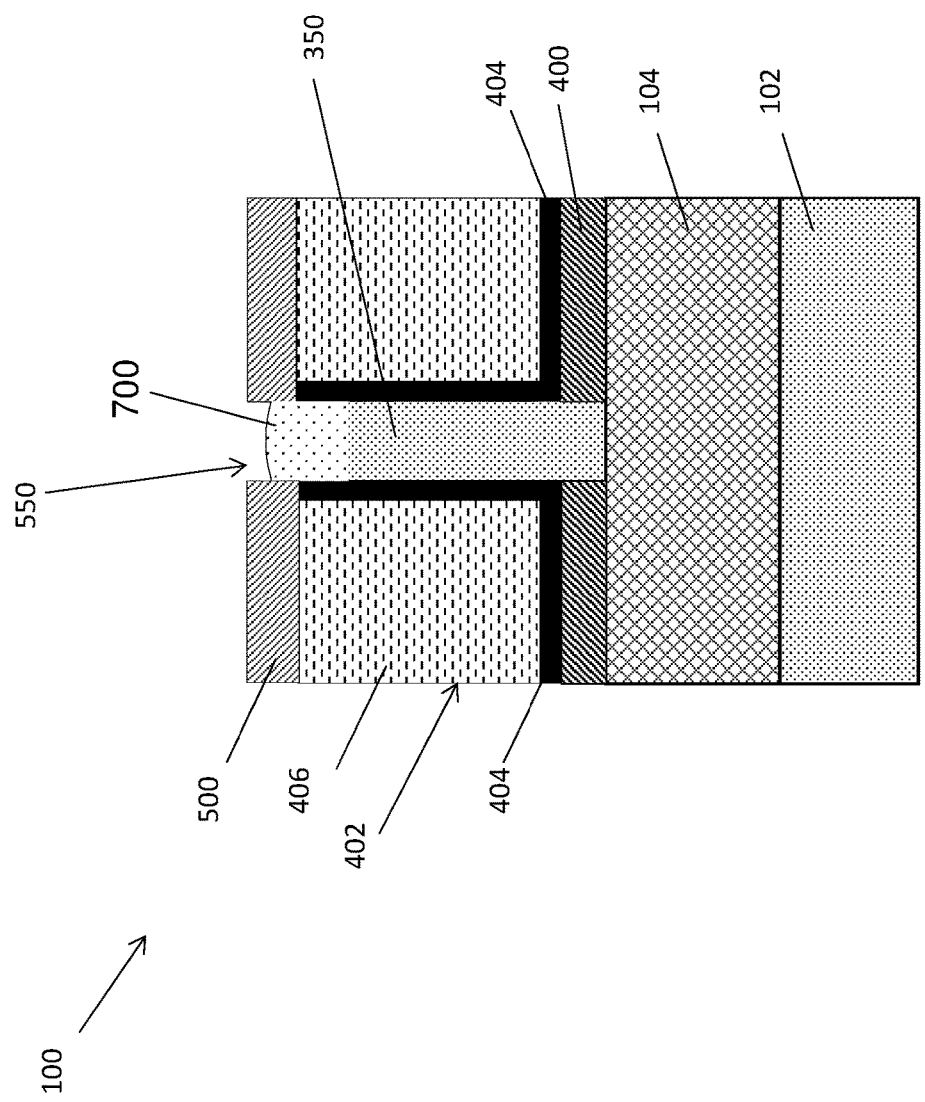
FIG. 8 depicts a cross-sectional view of the semiconductor structure after performing various fabrication processes according to embodiments of the invention according to embodiments of the invention.

In FIG. 8, known semiconductor fabrication operations have been applied to the semiconductor structure 100 to remove the converted recipient layer portion 702 and unreacted portions 602 from the upper surface of the top spacer 500. Accordingly, the trench 550 now exposes the band-gap enhancing region 700. A hydrofluoric acid etchant that is selective to oxide materials, for example, can be used to remove the $SiO_2$ converted portion 702 and remaining SiGeOx portions 602 previously shown in FIG. 7.

In FIG. 9, known semiconductor fabrication operations have been applied to the semiconductor structure 100 to form the final VFET structure 900 having reduced GIDL in accordance with embodiments of the invention. More specifically, FIG. 9 depicts the final VFET structure 900 following formation of an upper source/drain region 902. In the example illustrated in FIG. 9, the upper source/drain region 902 can serve as the drain, and can be formed by epitaxially growing a SiGe material from the exposed band-gap enhancing region 700 (e.g., the Si-rich layer). A thermal anneal process can be performed to form an upper source/drain junction 904. Accordingly, the band-gap enhancing region 700 is disposed directly between the upper source/drain region 902 and the un-reacted portion of the channel 350. In one or more embodiments, the band-gap enhancing region 700 contains the upper source/drain junction 904. In this manner, the increased band-gap of the and-gap enhancing region 700 (in this case the Si-rich material) mitigates band-to-band tunneling between the channel 350 and the upper source/drain region, thereby reducing the GIDL of the VFET 900.

Various epitaxy techniques can be used to grow upper source/drain region 902 including, but not limited to, vapor-phase epitaxy (VPE), molecular-beam epitaxy (MBE), liquid-phase epitaxy (LPE), or other suitable process. The terms "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a <100> orientated crystalline surface will take on a <100> orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial SiGe alloy layer can be formed utilizing a combination of such gas sources. Carrier gases like hydrogen, nitrogen, helium and argon can be used.

The material of the upper source/drain region 902 can also be doped during epitaxial growth process (in-situ doped). In embodiments of the invention, the SiGe material includes additional Ge atoms so that the atomic percentage of Ge in the upper source/drain region 902 is greater than the atomic percentage of Ge in the unreacted SiGe channel region 350. For example, the SiGe region 350 can contain about 20% to about 50% of Ge, while the upper source/drain region 902 can contain about 45% to about 65% Ge. Accordingly, the contact resistance between the upper source/drain region 902 and contact interface (e.g., contact metal interface) is reduced, while still achieving reduced GIDL using the band-gap enhancing region 700.

Although not illustrated, it should be appreciated that the VFET 900 can undergo various back end of line (BEOL) processes. For example, one or more electrically conductive contacts can be formed in ohmic contact with the upper S/D region 902 using known metallization techniques. The contact region can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials.

In embodiments of the invention, the contact region can include a metal (e.g., titanium) that reacts with semiconductor materials (e.g., the upper S/D region 902) to form a silicide film (not depicted) between the upper S/D region 902 and the contact region. Because the silicide film is only formed at the interface between the contact region and the upper S/D region 902, the silicide film can be said to be self-aligned to the upper S/D region 902.

Figure 10:
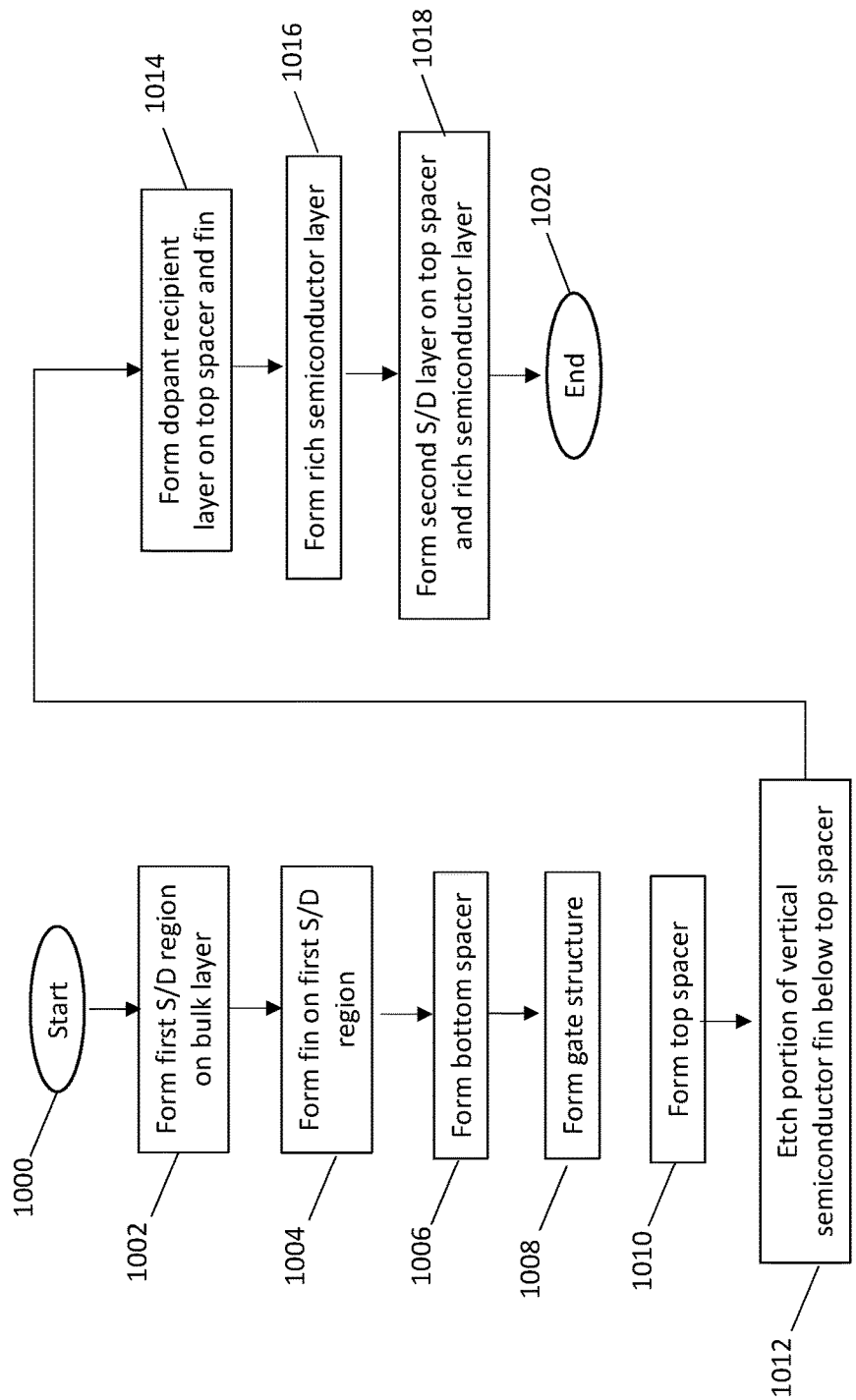
FIG. 10 depicts a flow diagram illustrating a method of fabricating a semiconductor device having a reduced gate-induced-drain-leakage (GIDL) according to embodiments of the invention.

Referring now to FIG. 10, a flow diagram illustrates a method of fabricating a VFET having reduced GIDL according to embodiments of the invention. The method begins at operation 1000, and at block 1002 a first S/D region is formed on a bulk semiconductor layer of a semiconductor substrate. At block 1004, a vertical semiconductor fin is formed on the first S/D region. At block 1006, a bottom spacer is formed over the first S/D region and around a lower portion of the vertical semiconductor fin. At block 1008, a gate structure is formed to cover the bottom spacer and to surround a portion of the vertical semiconductor fin. At block 1010, a top spacer is formed over the gate structure and around a portion of the vertical semiconductor fin. At block 1012, an upper portion of the vertical semiconductor fin is etched below the upper surface of the top spacer. At block 1014, a recipient layer is formed on the top spacer and on the upper portion of the semiconductor fin. At block

1016, a thermal anneal process is performed to pull out targeted atoms (e.g., Ge) from the upper portion semiconductor fin, thereby forming a Si-rich semiconductor layer. At block 1018, a second S/D region is formed on the Si-rich semiconductor layer, and the method ends at operation 1020. Following completion of the second S/D region (e.g., the drain), the Si-rich semiconductor layer is located between the non-reacted channel and the second source/drain region. Accordingly, band gap at the interface between the channel and the drain, for example, is increased, thereby reducing GIDL Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a semiconductor fin that extends vertically from a first source or drain (S/D) region of the semiconductor device, the semiconductor fin comprising a first type of semiconductor material having a first band gap;
    converting an upper portion of the semiconductor fin into a second semiconductor material having a second band gap that is greater than the first band gap; and
    forming a second S/D region on the second semiconductor material so that the second semiconductor material is interposed between a non-converted portion of the semiconductor fin and the second S/D region.

2. The method of claim 1, wherein converting the upper portion of the semiconductor fin further comprises:
    forming a sacrificial recipient layer on the upper portion of the semiconductor fin; and
    annealing the semiconductor device to pull targeted atoms from the upper portion of the semiconductor fin.

3. The method of claim 2, wherein the semiconductor fin comprises silicon germanium (SiGe), and the sacrificial recipient layer comprises silicon germanium oxide (SiGeOx) so that germanium (Ge) atoms from the upper portion are removed from the semiconductor fin.

4. The method of claim 3 further comprising forming a gate structure around sidewalls of the semiconductor fin to define a channel of the semiconductor device.

5. The method of claim 4, wherein the second semiconductor material is interposed between the channel and the second S/D region.

6. The method of claim 5, wherein the channel region contains a first percentage of Ge and the second S/D region contains a second percentage of the Ge greater than the first percentage.

7. The method of claim 6, wherein the first percentage is about 40% and the second percentage is about 65%.

8. A method of forming a semiconductor device, the method comprising:
    forming a vertical fin comprising a first semiconductor material having a first band gap, the vertical fin extending vertically from a first source or drain (S/D) region of the semiconductor device;
    forming a gate structure around portions of sidewalls of the vertical fin, wherein the portions of the vertical fin adjacent to the gate structure comprises a channel of the semiconductor device;
    forming a second S/D region on an upper portion of the vertical fin; and
    converting the upper portion of the vertical fin into a second semiconductor material having a second band gap that is greater than the first band gap to reduce a gate-induced-drain leakage (GIDL) between the second S/D region and the channel.

9. The method of claim 8, wherein converting the upper portion of the vertical fin further comprises:
    forming a sacrificial recipient layer on the upper portion of the vertical fin; and
    annealing the semiconductor device to pull targeted atoms out of the upper portion of the vertical fin.

10. The method of claim 9, wherein:
the vertical fin comprises a first semiconductor material including the targeted atoms; and
the sacrificial recipient layer comprises an oxide material configured to pull out the targeted atoms based at least in part on the annealing.

11. The method of claim 10, wherein the second semiconductor material is interposed between the channel and the second S/D region.

12. The method of claim 11, wherein a portion of the sacrificial recipient layer is converted into a third semiconductor material based at least in part on chemical reaction with semiconductor fin.

13. The method of claim 12, wherein the channel region contains a first percentage of a first type of atoms and the second S/D region contains a second percentage of the first type of atoms greater than the first percentage.

14. The method of claim 13, wherein the first type of atoms are germanium (Ge).

15. The method of claim 14, wherein the first percentage is approximately 20% and the second percentage is approximately 50%.

* * * * *